(12) United States Patent
Moehlmann et al.

(10) Patent No.: US 11,689,206 B1
(45) Date of Patent: Jun. 27, 2023

(54) CLOCK FREQUENCY MONITORING FOR A PHASE-LOCKED LOOP BASED DESIGN

(71) Applicant: NXP B.V., Eindhoven (NL)

(72) Inventors: Ulrich Moehlmann, Moisburg (DE); Andreas Lentz, Buchholz (DE)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 17/686,664

(22) Filed: Mar. 4, 2022

(51) Int. Cl.
*H03L 7/099* (2006.01)

(52) U.S. Cl.
CPC .......... *H03L 7/099* (2013.01); *H03L 2207/50* (2013.01)

(58) Field of Classification Search
CPC .............................. H03L 7/099; H03L 2207/50
See application file for complete search history.

(56) References Cited

U.S. PATENT DOCUMENTS

| | | | |
|---|---|---|---|
| 7,242,223 B1 | 7/2007 | Alon | |
| 9,300,305 B1* | 3/2016 | Kuo | H03L 7/093 |
| 10,826,505 B1* | 11/2020 | Moehlmann | H03L 7/087 |
| 11,184,013 B1* | 11/2021 | Grimaldi | H03C 3/095 |
| 11,218,153 B1* | 1/2022 | Moehlmann | H03L 7/0992 |
| 2007/0188244 A1* | 8/2007 | Waheed | H03L 7/113 |
| | | | 331/16 |
| 2016/0036454 A1* | 2/2016 | Moehlmann | H03L 7/0994 |
| | | | 327/147 |
| 2016/0087641 A1* | 3/2016 | Familia | H03L 7/099 |
| | | | 331/8 |
| 2016/0233870 A1* | 8/2016 | Van Engelen | H03L 7/0991 |
| 2016/0301415 A1* | 10/2016 | Waldrip | H03L 7/099 |
| 2017/0194973 A1* | 7/2017 | Moehlmann | H03L 7/12 |
| 2017/0264306 A1* | 9/2017 | Li | H03L 7/099 |
| 2019/0386663 A1* | 12/2019 | Candler | G04F 10/005 |
| 2020/0136628 A1* | 4/2020 | van den Heuvel | H03L 7/093 |
| 2020/0162081 A1 | 5/2020 | Jayakumar et al. | |
| 2020/0235746 A1* | 7/2020 | Candler | H03L 7/099 |
| 2021/0258013 A1* | 8/2021 | Wu | H03L 7/1075 |

FOREIGN PATENT DOCUMENTS

| | | | | | |
|---|---|---|---|---|---|
| CN | 112134558 A | * | 12/2020 | ........... | G04F 10/005 |
| EP | 3096460 A1 | * | 11/2016 | ............. | H03L 7/085 |
| EP | 3855625 A1 | * | 7/2021 | ............. | H03L 7/093 |
| EP | 3641135 B1 | * | 8/2022 | ............. | H02M 3/07 |

\* cited by examiner

*Primary Examiner* — Adam D Houston

(57) ABSTRACT

A method for clock frequency monitoring for a Phase-Locked Loop (PLL) based design includes determining a present operating point of an oscillator of the PLL based design, wherein the oscillator generates a present frequency in response to the present operating point. The present operating point of the oscillator is compared to a comparison range defined by a plurality of reference operating points, wherein the oscillator generates a nominal reference frequency in response to a nominal one of the plurality of reference operating points and the comparison range is further defined by a manufacturing process range, an operating voltage range and an operating temperature range. An action is performed in response to the present operating point being outside of the comparison range.

20 Claims, 5 Drawing Sheets

US 11,689,206 B1

CLOCK FREQUENCY MONITORING FOR A PHASE-LOCKED LOOP BASED DESIGN

FIELD

This disclosure relates generally to a Phase-Locked Loop (PLL), and more specifically to monitoring an attempted alteration of a PLL generated clock.

BACKGROUND

High performance digital electronic circuits are often based on clock synchronous designs. Specifically, registers in the design receive a clock to trigger the storage of information coming from a logic cone preceding the register. A logic cone represents the convergence of a multitude of signals generated synchronously at their source, which travel through logic gates to form a signal, which is synchronously latched. If the synchronous clock frequency is shortened, such that incomplete propagation occurs through the logic gates, the circuit may operate in an erroneous manner or enter an invalid state.

A design may be maliciously attacked by attempting to alter the clock frequency of the design and thereby cause an exploitable misbehavior of the design. A typical countermeasure to a clock frequency attack is provided with frequency monitor, which compares the intended clock frequency to the actual modified clock frequency. The frequency monitor may use a second internally generated clock, which suffers from poor frequency stability and thus less accuracy in detecting a deviation of the intended clock frequency during an attack.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

Figure 1:
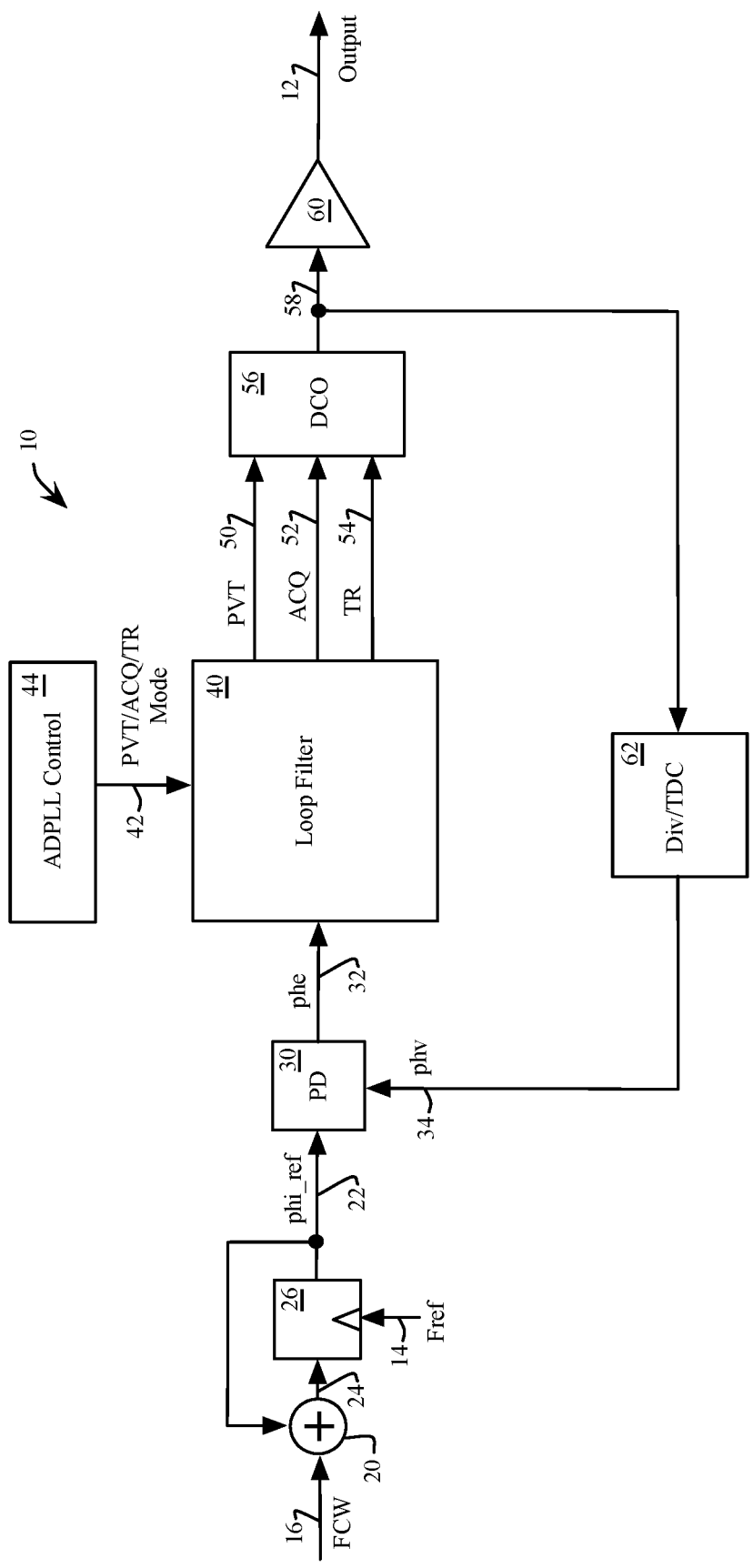
FIG. 1 is a schematic view of an embodiment of an All-Digital controlled Phase-Locked Loop (ADPLL).

Embodiments described herein provide for highly accurate clock frequency monitoring for a PLL based design, without the requirement for an additional reference clock. In some embodiments, monitoring changes to the PLL derived clock prevents malicious attacks on the PLL based design caused by intentional alteration of the PLL clock or its reference frequency. In other embodiments, monitoring changes to the PLL clock may also detect unintentional changes due to a variety of faults. Upon detection of a significant change to the PLL clock beyond design parameters, the PLL based design may perform an "action" such as entering a safe operation mode (for example with a preset unlocked clock frequency and reduced design functionality). In another embodiment, the action may comprise the PLL based design signaling other circuitry of a fault condition.

A reference operating point of the PLL may be determined during a production test of the PLL based design. In one example, during a wafer probe or packaged component test, an input to oscillator is measured for a desired frequency produced by the oscillator. In general terms, an operating point may be defined as voltage bias, current bias or digital representation thereof, which is used by an amplifier to work within the limits of a specification. The operating point of the oscillator is defined as a set of control settings that is needed to produce an oscillating signal with a frequency dependent upon the value of the operation point. For a design based on an ADPLL, the reference operating point may be represented by a capacitor bank control word. During operation of the design, the reference operating point is compared to a present operating point of the PLL, determined by measuring the input to the oscillator for a desired locked frequency. For a design based on an ADPLL, the present operating point may be represented by a capacitor bank control word, in a similar manner to the reference operating point. In one example, a combination of digital gates may be configured to compare respective capacitor bank control words of the present operating to the reference operating point.

A significant deviation of the present operating point from the reference operating point is determined when the present operating point exceeds an acceptable "range" of reference operating points, wherein the range may be determined by adding a frequency margin to the component-specific reference operating point. The frequency margin may be determined from a characterization of samples of the PLL based design with measurements and/or simulations performed over a range of design specific supply voltages, temperatures (e.g., a temperature of the PLL based on die or case temperature), and a process range determined from a variety of manufactured samples with shifted photo masks, dopant levels and the like. The determined range is relative to the reference operating point determined during production test and thus provides a range, within which the present operating point must occur for the PLL operation to be considered reliable and not subject to a malicious attack.

FIG. 1 shows an example embodiment 10 of an ADPLL. The embodiment 10 generates a frequency at an output 12 from a reference frequency 14 and a Frequency Control Word (FCW) 16. The FCW 16 is integrated by an adder circuit 20, adding the FCW 16 to a generated reference phase (phi_ref) 22 to produce a sum 24. The sum 24 is sampled with a sampling circuit 26 by the reference frequency 14 to produce the triangular-shaped reference phase 22. A phase detector circuit 30 produces a phase error 32 by comparing the reference phase 22 with a feedback phase word 34. A Loop Filter circuit 40 operates in a plurality of lock modes controlled by a signal 42 generated by an ADPLL control circuit 44. In one embodiment, the loop filter circuit 40 generates lock control signals including a Process Voltage Temperature (PVT) mode signal 50, an Acquisition (ACQ) mode signal 52 and a Tracking (TR) mode signal 54. One or more of the mode control signals control a DCO 56 to produce an output signal 58. The output signal 58, may be buffered by a buffer 60 to produce the frequency at the output 12. The output signal 58 may also be fed back to the phase detector circuit 30 through a divider and/or Time to Digital Converter (TDC) 62 to form a PLL closed loop.

In one embodiment, the PVT mode signal 50 provides a locking resolution with a wide frequency range, the ACQ mode signal 52 provides a locking resolution with a frequency range narrower than the PVT mode and the TR mode signal 54 provides a locking resolution with a frequency range narrower than the ACQ mode. The PVT mode signal 50 determines whether the present operating point is within the previously defined range. The ACQ mode signal 52 is an intermediate mode. The TR mode signal 54 ensures that the ADPLL settles to a desired output frequency with jitter and/or phase noise acceptable for the intended use case. Frequency deviations within the locking limits set by the ACQ mode signal 52 and the TR mode signal 54 are within the design limits of the PLL based design and will not be sufficient to constitute a frequency attack.

Figure 2:
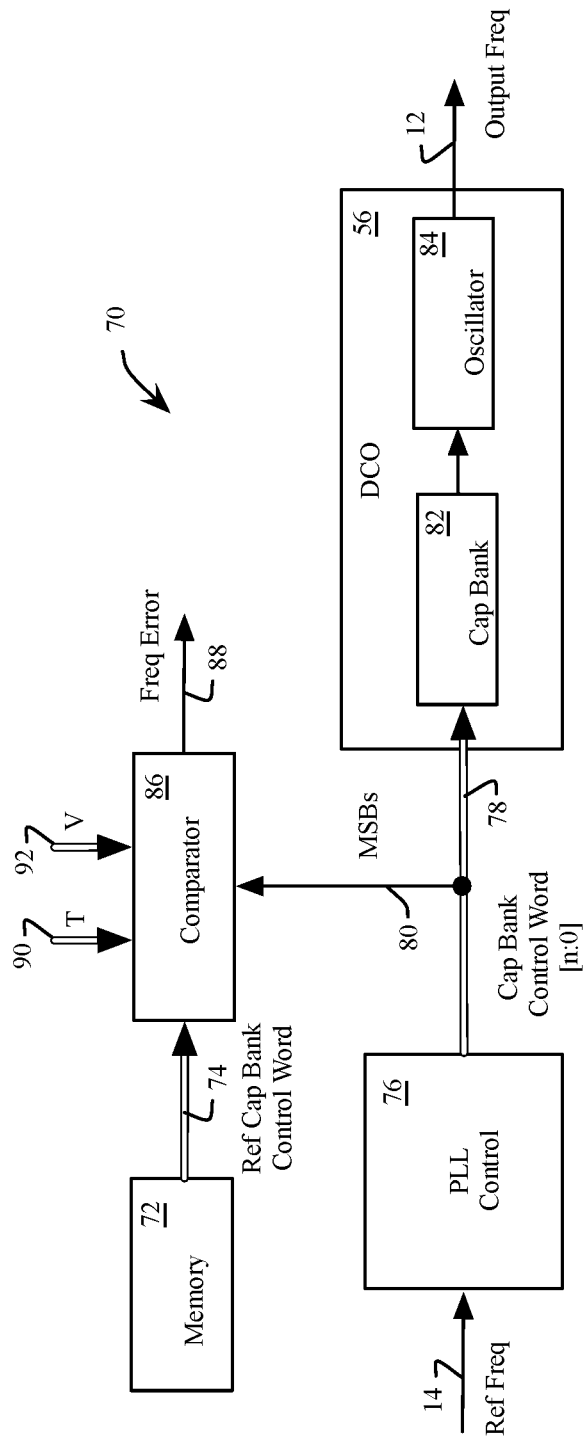
FIG. 2 is a schematic view of a system for clock frequency monitoring for a PLL based design, in accordance with example embodiments of the present disclosure.

FIG. 2 shows an example embodiment 70 of a portion of a PLL based design with further functional detail of the clock frequency monitoring. For ease of illustration, the PLL control circuit 76 includes the FCW integration, phase detection, ADPLL control circuit 44 and loop filter 40, while the feedback from the DCO 56 to the phase detect circuit 30 is not shown. In other embodiments, the functional blocks of FIG. 2 may be physically grouped in various combinations to achieve the same function.

The embodiment 70 includes a memory 72 to store the reference operating point of the embodiment 70 determined during a production test. In one embodiment, the memory 72 also includes the range of reference operating points that the embodiment 70 is designed to operate within. In another embodiment, the range may be stored in a separate memory (not shown) from the reference operating point. In various embodiments, the memory may be a non-volatile memory, including but not limited to a One Time Programmable (OTP) memory. The memory 72 generates a digital output 74 of the reference operating point formatted as a reference capacitor bank control word. In one embodiment the definition of the range of valid cap bank control words is stored in the memory as well and provided to the comparator. In another embodiment the definition of the range is hardcoded inside the comparator. A PLL control circuit 76 generates a digital output 78 of the present operating point formatted as a capacitor bank control word. One or more of the highest order bits (e.g., Most Significant Bits) are connected to a net 80.

The DCO 56, includes a capacitor bank 82 connected to the digital output 78 and an oscillator 84 controlled by the capacitor bank 82. The oscillator 84 provides an output frequency on the output 12. A comparator circuit 86 compares the reference capacitor bank control word on the digital output 74 with one or more of the highest order bits on net 80 to determine a frequency error on net 88. In one embodiment, the capacitor bank control word allocates one or more highest order bits for the PVT mode 50, while the lower order bits are allocated to the ACQ 52 mode and TR mode 54. The comparator 86 may further include a temperature sensor input 90 and a voltage sensor input 92.

In one embodiment, the temperature sensor 90 measures a measured temperature of the DCO and allows for a narrowing of the range by estimating a frequency shift of the reference operating point using a predetermined temperature coefficient of the oscillator. In another embodiment, the voltage sensor 92 measures a measured supply voltage of the DCO and allows for a narrowing of the range by estimating a frequency shift of the reference operating point using a predetermined voltage coefficient of the oscillator. In another embodiment, the range is widened by a frequency margin proportional to a predicted temperature drift of the PLL (e.g., the embodiment 10 of FIG. 1). Other embodiments may use one or more of the temperature sensor input 90, the voltage sensor input 92 and/or the frequency margin to modify the range defined by the plurality of reference operating points.

Figure 3:
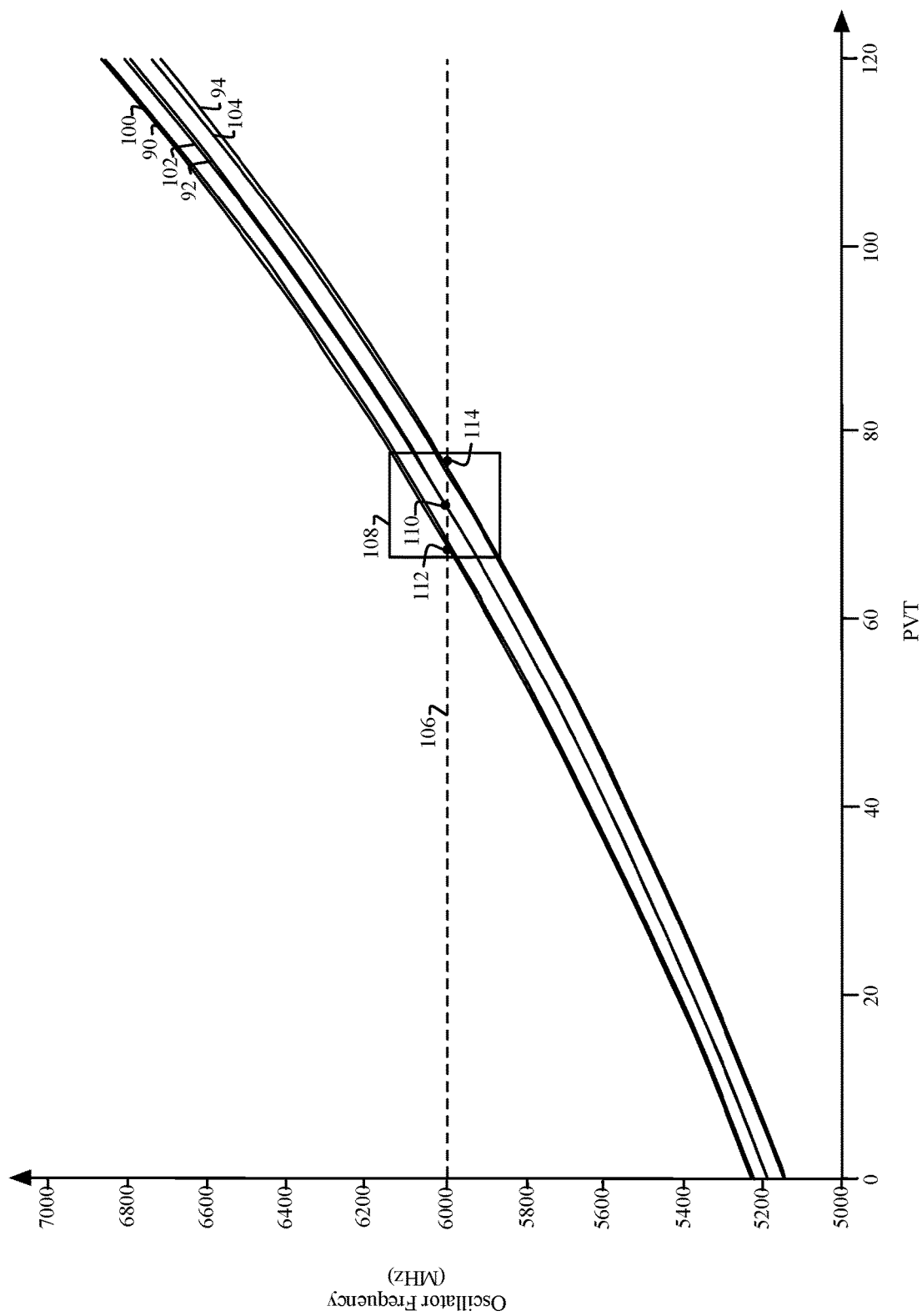
FIG. 3 is a graphical view of a Digitally Controlled Oscillator (DCO) characteristic relative to process, voltage and temperature variation, in accordance with example embodiments of the present disclosure.

FIG. 3 shows a graphical view of DCO frequency characteristics relative to process, voltage and temperature variation. Specifically with reference to FIG. 2, the output frequency on the output 12 is plotted against values of the reference capacitor bank control word on net 74. During the characterization and/or simulation process, reference operating points and the resulting oscillator output frequency are measured. For example, the curves 90, 92 and 94 are measured for a minimal supply voltage with an oscillator temperature of −40 C, 50 C and 150 C respectively. Similarly, the curves 100, 102 and 104 are measured for a maximum supply voltage with an oscillator temperature of −40 C, 50 C and 150 C respectively. The oscillator 84 is designed to operate with a nominal frequency 106 centered within a characterized and/or simulated range 108, and with a nominal reference operating point 110 measured during a production test. The range 108 is defined as an acceptable variation of oscillator frequencies over an acceptable variation of process, voltages and temperatures. For example, the oscillator 84 may operate between the minimum and maximum reference operating points 112 and 114 respectively. Operation outside of the range 108, with a present operating point being greater than the maximum reference operating point 114 or less than the minimum reference operating point 112 may generate a frequency error on net 88 (see FIG. 2). As discussed with respect to FIG. 2, the range 108 may be further modified with the temperature sensor input 90, the voltage sensor input 92 and/or the frequency margin.

Figure 4:
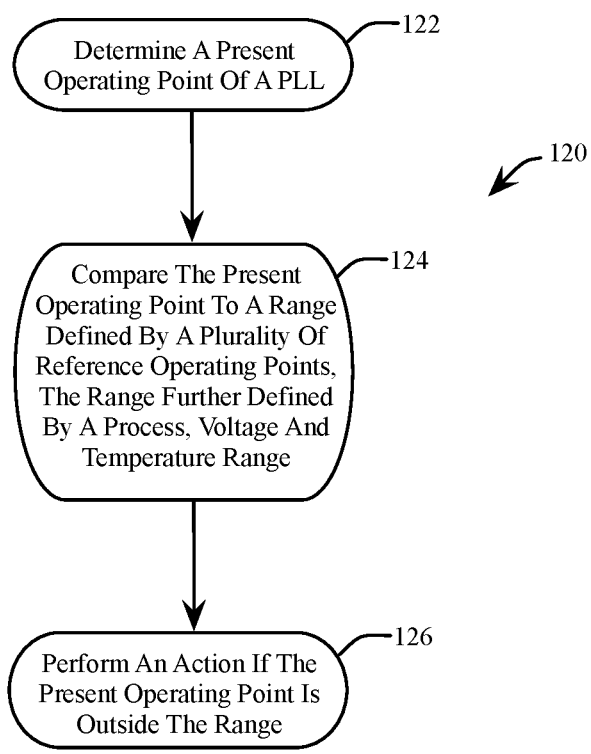
FIG. 4 is a flowchart representation of a method for clock frequency monitoring for a PLL based design, in accordance with an embodiment of the present disclosure.

FIG. 4 shows an example embodiment 120 of a method for clock frequency monitoring for a PLL based design. With continued reference to FIG. 2 and FIG. 3, at 122 a present operation point of the PLL is determined (see capacitor bank control word on net 78). At 124, the present operating point is compared to a range 108 defined by a plurality of reference operating points, and further defined by a process, voltage and temperature range (e.g., horizontal axis of FIG. 3). At 126, an action is performed if the present operating point (MSBs on net 80) is outside the range 108. For example, the action is performed in response to a frequency error on net 88.

Figure 5:
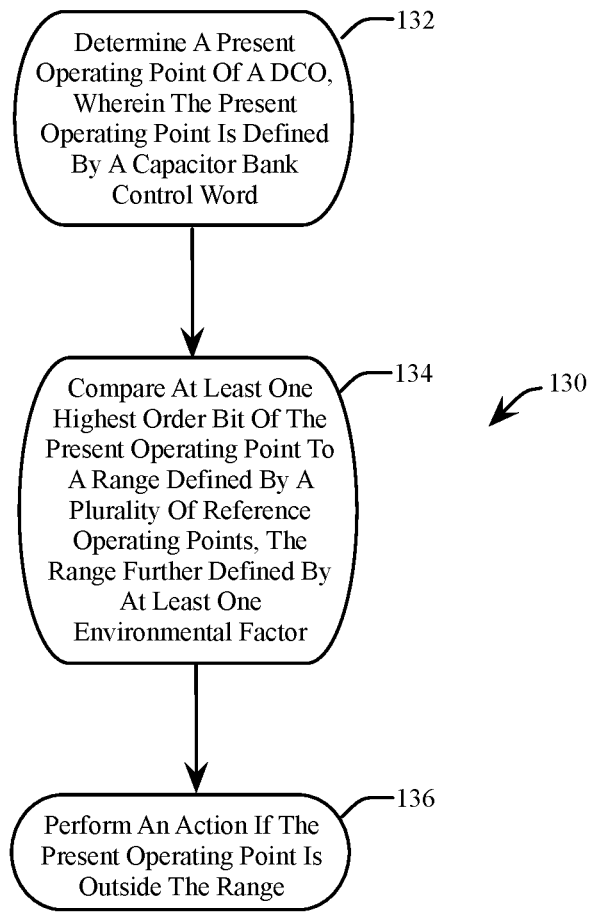
FIG. 5 is a flowchart representation of another method for clock frequency monitoring for a PLL based design, in accordance with an embodiment of the present disclosure.

FIG. 5 shows an example embodiment 130 of another method for clock frequency monitoring for a PLL based design. With continued reference to FIG. 2 and FIG. 3, at 132 a present operation point of the DCO 56 is determined, wherein the present operating point is defined by a capacitor bank control word (e.g., on net 78). At 134, the highest order bit of the present operating point (e.g., one or more MSBs on net 80) is compared to the range 108. The range 108 is defined by at least one environmental factor (e.g., process, voltage, temperature or another environmental factor). At 136, an action is performed if the present operating point (MSBs on net 80) is outside the range 108. For example, the action is performed in response to a frequency error on net 88.

As will be appreciated, at least some of the embodiments as disclosed include at least the following. In one embodiment, a method for clock frequency monitoring for a Phase-Locked Loop (PLL) based design comprises determining a present operating point of an oscillator of the PLL based design, wherein the oscillator generates a present frequency in response to the present operating point. The present operating point of the oscillator is compared to a comparison range defined by a plurality of reference operating points, wherein the oscillator generates a nominal reference frequency in response to a nominal one of the plurality of reference operating points and the range is further defined by a manufacturing process range, an operating voltage range and an operating temperature range. An action is performed in response to the present operating point being outside of the comparison range.

Alternative embodiments of the method for clock frequency monitoring for a Phase-Locked Loop (PLL) based design include one of the following features, or any combination thereof. The present frequency is locked with one or more lock modes, wherein each lock mode comprises a respective lock interval being less than the comparison range. The comparison range is narrowed with a measured temperature of the oscillator by modifying the nominal reference frequency with the measured temperature and a temperature coefficient of the oscillator. The comparison range is narrowed with a measured supply voltage of the oscillator by modifying the nominal reference frequency with the measured supply voltage and a voltage coefficient of the oscillator. The comparison range is increased by adding a frequency margin proportional to a predicted temperature drift of the PLL. The comparison range is determined by adding the nominal one of the plurality of reference operating points, determined by testing each PLL based design, to a frequency margin determined by characterizing a sample of PLL based designs over the manufacturing process range, the operating voltage range and the operating temperature range. The oscillator comprises a digitally controlled oscillator (DCO), wherein the present operating point is defined by a capacitor bank control word, and at least one highest order bit of the capacitor bank control word is compared to the comparison range. The range is stored in a memory. The memory comprises a non-volatile memory.

In another embodiment, an apparatus comprises a Phase-Locked Loop (PLL) based design comprising a Digitally Controlled Oscillator (DCO) configured to generate a present frequency in response to a present operating point. A memory is configured to store a comparison range defined by a plurality of reference operating points, wherein the DCO is configured to generate a nominal reference frequency in response to a nominal one of the plurality of reference operating points and the comparison range is further defined by a manufacturing process range, an operating voltage range and an operating temperature range. A capacitor bank control word is configured to define a present operating point of the DCO. A controller is configured to compare at least one highest order bit of the capacitor bank control word to the comparison range and performing an action in response thereto.

Alternative embodiments of the apparatus include one of the following features, or any combination thereof. The PLL based design further comprises one or more lock modes, each comprising a respective lock interval being less than the comparison range. A temperature sensor is configured to measure a measured temperature of the DCO, and the controller narrows the comparison range by modifying the nominal reference frequency with the measured temperature and a temperature coefficient of the oscillator. A voltage sensor is configured to measure a measured supply voltage of the DCO, and the controller narrows the comparison range by modifying the nominal reference frequency with the measured supply voltage and a voltage coefficient of the oscillator. The comparison range comprises a frequency margin proportional to a predicted temperature drift of the PLL. The memory comprises a non-volatile memory. A digital comparator is coupled to the controller and configured to compare at least one highest order bit of the capacitor bank control word to the comparison range.

In another embodiment, a method for clock frequency monitoring for a Phase-Locked Loop (PLL) design comprises determining a present operating point of a digitally controlled oscillator (DCO) of the PLL based design, wherein the DCO generates a present frequency in response to the present operating point, and the present operating point is defined by a capacitor bank control word. At least one highest order bit of the capacitor bank control word is compared to a comparison range defined by a plurality of reference operating points, wherein the DCO generates a nominal reference frequency in response to a nominal one of the plurality of reference operating points and the comparison range is further defined by at least one environmental factor. An action is performed in response to the present operating point being outside of the comparison range.

Alternative embodiments of the method for clock frequency monitoring for a Phase-Locked Loop (PLL) design include one of the following features, or any combination thereof. The at least one environmental factor comprises at least one of an operating voltage range and an operating temperature range. The comparison range is narrowed with a measured temperature of the DCO by modifying the nominal reference frequency with the measured temperature and a temperature coefficient of the DCO. The comparison range is narrowed with a measured supply voltage of the DCO by modifying the nominal reference frequency with the measured supply voltage and a voltage coefficient of the DCO.

Although the invention is described herein with reference to specific embodiments, various modifications and changes can be made without departing from the scope of the present invention as set forth in the claims below. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A method for clock frequency monitoring for a Phase-Locked Loop (PLL) based design comprising:
    determining a present operating point of an oscillator of the PLL based design, wherein the oscillator generates a present frequency in response to the present operating point;
    comparing the present operating point of the oscillator to a comparison range defined by a plurality of reference operating points, wherein the oscillator generates a nominal reference frequency in response to a nominal one of the plurality of reference operating points and the comparison range is further defined by a manufacturing process range, an operating voltage range and an operating temperature range; and performing an action in response to the present operating point being outside of the comparison range.

2. The method of claim 1 further comprising locking the present frequency with one or more lock modes, wherein each lock mode comprises a respective lock interval being less than the comparison range.

3. The method of claim 1 wherein the comparison range is narrowed with a measured temperature of the oscillator by modifying the nominal reference frequency with the measured temperature and a temperature coefficient of the oscillator.

4. The method of claim 1 wherein the comparison range is narrowed with a measured supply voltage of the oscillator by modifying the nominal reference frequency with the measured supply voltage and a voltage coefficient of the oscillator.

5. The method of claim 1 wherein the comparison range is increased by adding a frequency margin proportional to a predicted temperature drift of the PLL.

6. The method of claim 1 wherein the comparison range is determined by adding the nominal one of the plurality of reference operating points, determined by testing each PLL based design, to a frequency margin determined by characterizing a sample of PLL based designs over the manufacturing process range, the operating voltage range and the operating temperature range.

7. The method of claim 1 wherein the oscillator comprises a digitally controlled oscillator (DCO), wherein the present operating point is defined by a capacitor bank control word, and at least one highest order bit of the capacitor bank control word is compared to the comparison range.

8. The method of claim 1 further comprising storing the range in a memory.

9. The method of claim 8, wherein the memory comprises a non-volatile memory.

10. An apparatus comprising:
a Phase-Locked Loop (PLL) based design comprising a Digitally Controlled Oscillator (DCO) configured to generate a present frequency in response to a present operating point;
a memory configured to store a comparison range defined by a plurality of reference operating points, wherein the DCO is configured to generate a nominal reference frequency in response to a nominal one of the plurality of reference operating points and the comparison range is further defined by a manufacturing process range, an operating voltage range and an operating temperature range;
a capacitor bank control word configured to define a present operating point of the DCO; and
a controller configured to compare at least one highest order bit of the capacitor bank control word to the comparison range performing an action in response thereto.

11. The apparatus of claim 10 wherein the PLL based design further comprises one or more lock modes, each comprising a respective lock interval being less than the comparison range.

12. The apparatus of claim 10 further comprising a temperature sensor configured to measure a temperature of the DCO, and the controller narrowing the comparison range by modifying the nominal reference frequency with the measured temperature and a temperature coefficient of the oscillator.

13. The apparatus of claim 10 further comprising a voltage sensor configured to measure a measured supply voltage of the DCO, and the controller narrowing the comparison range by modifying the nominal reference frequency with the measured supply voltage and a voltage coefficient of the oscillator.

14. The apparatus of claim 10 wherein the comparison range comprises a frequency margin proportional to a predicted temperature drift of the PLL.

15. The apparatus of claim 10 wherein the memory comprises a non-volatile memory.

16. The apparatus of claim 10 further comprising a digital comparator coupled to the controller and configured to compare at least one highest order bit of the capacitor bank control word to the comparison range.

17. A method for clock frequency monitoring for a Phase-Locked Loop (PLL) design comprising:
determining a present operating point of a digitally controlled oscillator (DCO) of the PLL based design, wherein the DCO generates a present frequency in response to the present operating point, and the present operating point is defined by a capacitor bank control word;
comparing at least one highest order bit of the capacitor bank control word to a comparison range defined by a plurality of reference operating points, wherein the DCO generates a nominal reference frequency in response to a nominal one of the plurality of reference operating points and the comparison range is further defined by at least one environmental factor; and
performing an action in response to the present operating point being outside of the comparison range.

18. The method of claim 17 wherein the at least one environmental factor comprises at least one of an operating voltage range and an operating temperature range.

19. The method of claim 17 wherein the comparison range is narrowed with a measured temperature of the DCO by modifying the nominal reference frequency with the measured temperature and a temperature coefficient of the DCO.

20. The method of claim 17 wherein the comparison range is narrowed with a measured supply voltage of the DCO by modifying the nominal reference frequency with the measured supply voltage and a voltage coefficient of the DCO.

* * * * *